United States Patent
Kanda

(10) Patent No.: US 6,883,636 B2
(45) Date of Patent: Apr. 26, 2005

(54) POWER STEERING APPARATUS

(75) Inventor: Koji Kanda, Kyoto (JP)

(73) Assignee: Koyo Seiko Co., Ltd., Osaka (JP)

( * ) Notice: Subject to any disclaimer, the term of this patent is extended or adjusted under 35 U.S.C. 154(b) by 120 days.

(21) Appl. No.: 10/277,682

(22) Filed: Oct. 23, 2002

(65) Prior Publication Data
US 2003/0079934 A1 May 1, 2003

(30) Foreign Application Priority Data
Oct. 29, 2001 (JP) ........................................ 2001-331266

(51) Int. Cl.$^7$ ............................................. B62D 5/04
(52) U.S. Cl. ........................ 180/446; 180/443; 701/41
(58) Field of Search ................................ 180/443, 444, 180/446; 701/36, 41

(56) References Cited

U.S. PATENT DOCUMENTS

| | | | |
|---|---|---|---|
| 4,621,327 A | 11/1986 | Dolph et al. | |
| 4,882,586 A | 11/1989 | Dolph et al. | |
| 5,602,451 A | 2/1997 | Kohge et al. | |
| 5,761,627 A | * 6/1998 | Seidel et al. | 701/41 |
| 5,999,870 A | * 12/1999 | Tatsumi et al. | 701/43 |
| 6,408,324 B1 | * 6/2002 | Wallace et al. | 718/107 |
| 6,690,138 B2 | * 2/2004 | Kaji et al. | 180/443 |

FOREIGN PATENT DOCUMENTS

| | | |
|---|---|---|
| EP | 0 423 737 A1 | 4/1991 |
| JP | 05-304795 | 11/1993 |

* cited by examiner

Primary Examiner—Lesley D. Morris
Assistant Examiner—Matthew Luby
(74) Attorney, Agent, or Firm—Rabin & Berdo, P.C.

(57) ABSTRACT

A power steering apparatus for assisting steering by conferring a steering assisting force according to a steering manipulation to a steering mechanism. The apparatus includes an electric motor being driven under control according to the steering manipulation, and a deteriorated condition judging factor storage portion for storing a factor used for judging a deteriorated condition of the electric motor. The factor used for judging the deteriorated condition of the electric motor includes, for example, an accumulated value of load exerted on the electric motor.

10 Claims, 4 Drawing Sheets

POWER STEERING APPARATUS

BACKGROUND OF THE INVENTION

1. Field of the Invention

The invention relates to a power steering apparatus for assisting steering through torque generated by an electric motor or a hydraulic pressure generated by an oil pump driven by the electric motor.

2. Description of Related Arts

Conventionally, a power steering apparatus that confers a steering assisting force according to a steering manipulation to a steering mechanism has been employed to assist steering. Such a power steering apparatus includes, for example, an electric type in which torque generated by an electric motor is conferred to the steering mechanism as a steering assisting force, and an electro-hydraulic pump type in which an oil pump is driven by an electric motor to feed hydraulic fluid to a power cylinder from the oil pump, and toque generated by the power cylinder is conferred to the steering mechanism as a steering assisting force.

Incidentally, in some of vehicles to be scrapped due to an accident or expiration of the life of an engine, an electric motor or an electronic control unit for controlling the driving of the electric motor remains usable in a steering apparatus mounted on the vehicle. However, a degree of deterioration with use to date is uncertain, and therefore, the remaining usage time cannot be estimated, which makes it impossible to reuse the electric motor or the electronic control unit collected from a vehicle to be scrapped.

SUMMARY OF THE INVENTION

An object of the invention is to provide a power steering apparatus capable of judging a deteriorated condition of the electric motor or the electronic control unit.

A power steering apparatus according to a first aspect of the invention is a power steering apparatus for assisting steering by conferring a steering assisting force according to a steering manipulation to a steering mechanism. The apparatus includes an electric motor being driven under control according to the steering manipulation, and a deteriorated condition judging factor storage portion for storing a factor used for judging a deteriorated condition of the electric motor.

According to the invention, for example, when a vehicle on which is mounted the power steering apparatus is scrapped, a deteriorated condition of the electric motor can be judged based on a judging factor stored in the deteriorated condition judging factor storage portion. It is thus possible to judge whether the electric motor is reusable or not and therefore needs to be collected from the vehicle. Also, by taking the statistic of the judging factor read out from the deteriorated condition judging factor storage portion mounted on each of many vehicles to be scrapped, a relationship between the usage time and a deteriorated condition of the electric motor can be analyzed, which makes it easier to achieve the optimum life design of the electric motor.

The factor used for judging the deteriorated condition of the electric motor may be an accumulated value of load exerted on the electric motor, or a history of load exerted on the electric motor. Alternatively, it may be an accumulated value of a quantity of deterioration calculated based on the temperature of the electric motor or an ambient temperature in surroundings of the electric motor. Further, it may be a history of a quantity of deterioration calculated based on the temperature of the electric motor or an ambient temperature in surroundings of the electric motor, or a history of the temperature of the electric motor or an ambient temperature in surroundings of the electric motor.

A power steering apparatus according a second aspect of the invention is a power steering apparatus for assisting steering by conferring a steering assisting force according to a steering manipulation to a steering mechanism. The apparatus includes an electronic control unit for controlling the steering assisting force to be conferred to the steering mechanism, and a deteriorated condition judging factor storage portion for storing a factor used for judging a deteriorated condition of the electronic control unit.

According to the invention, for example, when a vehicle on which is mounted the power steering apparatus is scrapped, a deteriorated condition of the electronic control unit can be judged based on a judging factor stored in the deteriorated condition judging factor storage portion. It is thus possible to judge whether the electronic control unit is reusable or not and therefore needs to be collected from the vehicle. Also, by taking the statistic of the judging factor read out from the deteriorated condition judging factor storage portion mounted on each of many vehicles to be scrapped, a relationship between the usage time and a deteriorated condition of the electronic control unit can be analyzed, which makes it easier to achieve the optimum life design of the electronic control unit.

The factor used for judging the deteriorated condition of the electronic control unit may be an accumulated value of a quantity of deterioration calculated based on the temperature of the electronic control unit or an ambient temperature in surroundings of the electronic control unit, or a history of a quantity of deterioration calculated based on the temperature of the electronic control unit or an ambient temperature in surroundings of the electronic control unit. Alternatively, it may be a history of the temperature of the electronic control unit or an ambient temperature in surroundings of the electronic control unit.

The electric motor may be a power source of the steering assisting force to be conferred to the steering mechanism, and the electronic control unit may be a device that controls the electric motor operating as the power source of the steering assisting force under control according to a steering manipulation.

Further, the electric motor may be a driving source of an oil pump that feeds hydraulic fluid to a power cylinder operating as a power source of the steering assisting force to be conferred to the steering mechanism, and the electronic control unit may be a device that drives the electric motor operating as the driving source of the oil pump under control according to a steering manipulation.

The above and other objects, features, and advantages of the invention will become more apparent from the following description of embodiments with reference to the accompanying drawings.

DESCRIPTION OF THE PREFERRED EMBODIMENTS

Figure 1:
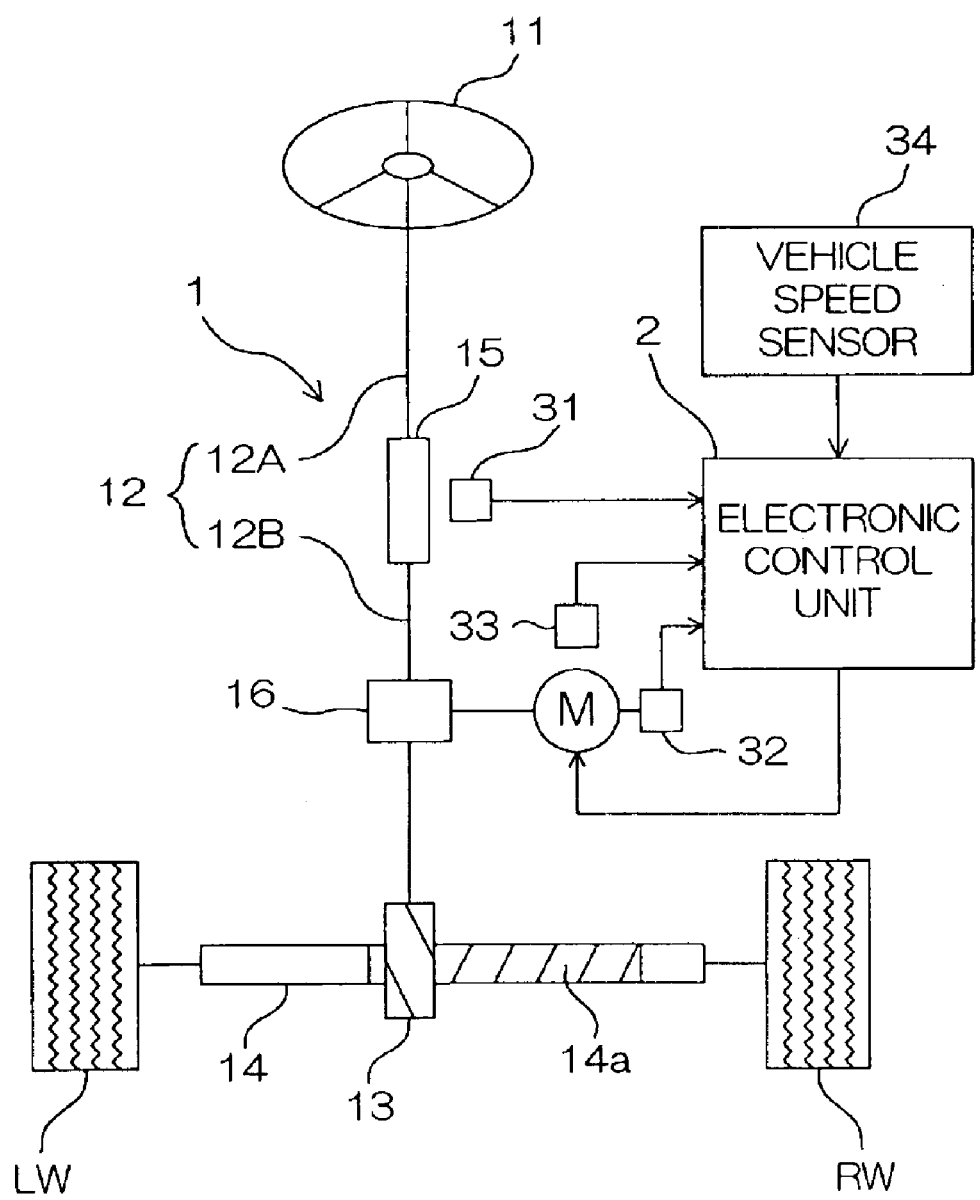
FIG. 1 is a conceptual illustration showing a basic arrangement of an electric power steering apparatus according to one embodiment of the invention.

FIG. 1 is a conceptual illustration showing a basic arrangement of an electric power steering apparatus according to one embodiment of the invention. The electric power steering apparatus is provided in association with a steering mechanism 1 of a vehicle, and is used to confer a steering assisting force to the steering mechanism 1.

The steering mechanism 1 includes a steering wheel 11 manipulated by a driver, a steering shaft 12 linked to the steering wheel 11, a pinion gear 13 provided at the front end of the steering shaft 12, and a rack bar 14 extending in the width direction of the vehicle. The rack bar 14 is provided with a rack gear portion 14a, which is meshed with the pinion gear 13. Also, wheels LW and RW used for steering are coupled respectively to the both ends of the rack bar 14 through tie rods and knuckle arms (not shown), and a linear motion of the rack bar 14 in the width direction of the vehicle is converted to a rotary steering force of the wheels LW and RW by the tie rods and the knuckle arms.

According to this arrangement, rotations of the steering shaft 12 are converted to a linear motion of the rack bar 14 first by the pinion gear 13 and the rack gear portion 14a, then converted to a rotary steering force depending on a direction of the linear motion, and transmitted to the wheels LW and RW.

The steering shaft 12 is divided into an input shaft 12A coupled to the steering wheel 11 and an output shaft 12B coupled to the rack bar 14. The input shaft 12A and the output shaft 12B are linked to each other through a torsion bar 15 on which torsion is caused from relative rotations of these two shafts. The output shaft 12B is provided with a reduction mechanism 16 interposed somewhere about the midpoint, and a rotational force of an electric motor M is thereby inputted into the output shaft 12B as a steering assisting force through the reduction mechanism 16.

The electric motor M is supplied with a driving current from an electronic control unit 2. Connected to the electronic control unit 2 are: a torque sensor 31 for detecting a direction and magnitude of torsion caused on the torsion bar 15 as steering torque; a rotor rotational position sensor 32 for detecting a rotational position of a rotor (rotor rotational position) of the electric motor M; a motor current sensor 33 for detecting a current (motor current) flowing through the electric motor M; and a vehicle speed sensor 34 for detecting a running speed (vehicle speed) of the vehicle on which the electric power steering apparatus is mounted. The electronic control unit 2 sets a current command value based on the detection results from the torque sensor 31, the rotor rotational position sensor 32, and the vehicle speed sensor 34, and effects feedback control on a driving current flowing through the electric motor M based on the current command value thus set and a value of the motor current detected by the motor current sensor 33.

Also, in this embodiment, the electronic control unit 2 is furnished with a function of calculating an accumulated value of load exerted on the electric motor M, and storing the calculated accumulated value of load as a factor used for judging a deteriorated condition (a degree of deterioration) of the electric motor M. According to this arrangement, when a vehicle on which is mounted the electric power steering apparatus is scrapped, a deteriorated condition of the electric motor M can be judged based on the accumulated value of load stored in the electronic control unit 2, and it is thus possible to judge, for example, whether the electric motor M is reusable or not and therefore needs to be collected from the vehicle. Also, by taking the statistic of the accumulated value of load read out from the electronic control unit 2 for each vehicle when it is scrapped, a relationship between the usage time of the electric motor M and load exerted thereon can be analyzed, which makes it easier to achieve the optimum life design of the electric motor M.

Figure 2:
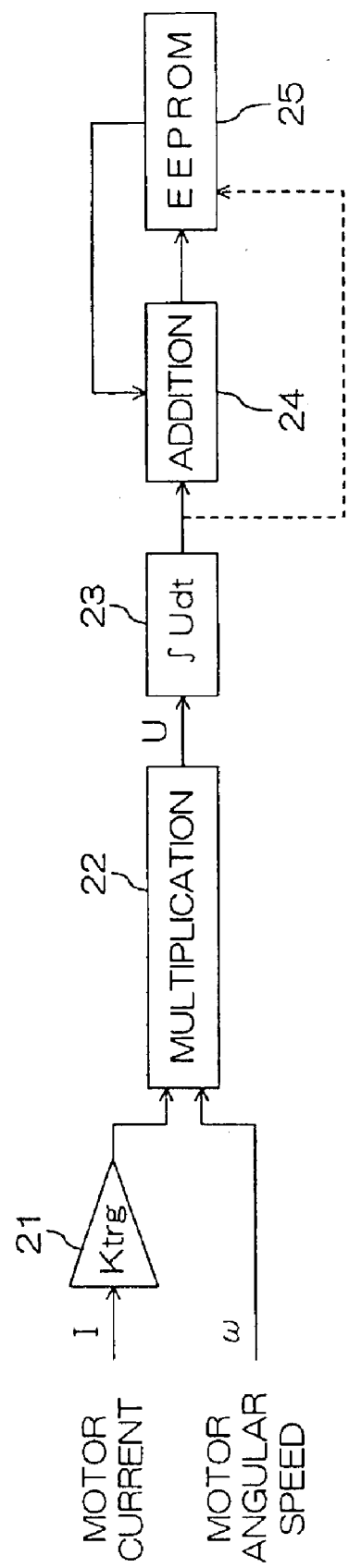
FIG. 2 is a block diagram explaining a function furnished to an electronic control unit for storing an accumulated value of load.

FIG. 2 is a block diagram explaining a function furnished to the electronic control unit 2 for storing an accumulated value of load. The electronic control unit 2 is provided with a torque calculation portion 21, a multiplication portion 22, a time integration portion 23, and an addition portion 24 that cooperatively calculate an accumulated value of load, and an EEPROM (Electrically Erasable Programmable ROM) 25 for storing the accumulated value of load. The torque calculation portion 21, the multiplication portion 22, the time integration portion 23, and the addition portion 24 are achieved through software by running a program on a CPU installed in the electronic control unit 2.

The torque calculation portion 21 multiplies a motor current value I detected by the motor current sensor 33 by a predetermined torque constant Ktrg and thereby calculates torque Ktrg·I (Nm) generated by the electric motor M. The calculated torque Ktrg·I is inputted into the multiplication portion 22.

The multiplication portion 22 also receives a motor angular speed ω, which is a time differential value of the rotor rotational position detected by the rotor rotational position sensor 32. The multiplication portion 22 multiplies the torque Ktrg·I inputted from the torque calculation portion 21 by the motor angular speed ω(rad/s), and thereby calculates power U of the electric motor M. The calculated power U=Ktrg·I·ω(Nm·rad/s) is inputted into the time integration portion 23.

The time integration portion 23 integrates the power U inputted from the multiplication portion 22 with respect to time. The calculations in both the torque calculation portion 21 and the multiplication portion 22 are repetitively performed while the rotor rotational position sensor 32 and the motor current sensor 33 continue their detecting operations since the ignition key switch of the vehicle is turned ON. The time integration portion 23 thus calculates work ∫Udt having been done by the electric motor M while the ignition key switch stays ON. The work ∫Udt having been done by the electric motor M is equal to a total of load exerted on the electric motor M while the ignition key switch stays ON.

The work ∫Udt calculated in the time integration portion 23 while the ignition key switch stays ON is inputted into the addition portion 24 in response to turning-OFF of the ignition key switch. Upon input of the work ∫Udt from the time integration portion 23, the addition portion 24 reads out the accumulated value of load stored in the EEPROM 25. Then, it adds the work ∫Udt inputted from the time integration portion 23 to the read accumulated value of load, and writes the sum into the EEPROM 25 as a new accumulated value of load. An accumulated value of the work ∫Udt performed by the electric motor M, that is, an accumulated value of load exerted on the electric motor M since the electric power steering apparatus was mounted on the vehicle is thus stored into the EEPROM 25.

Figure 3:
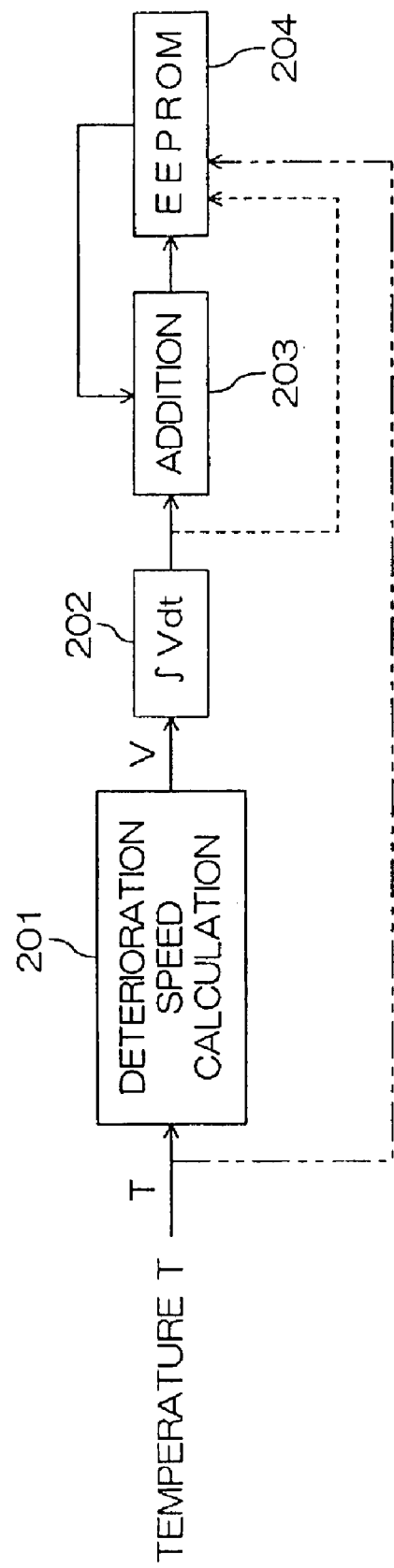
FIG. 3 is a block diagram explaining an arrangement according to another embodiment of the invention.

FIG. 3 is a block diagram explaining an arrangement according to another embodiment of the invention. In the first embodiment described above, the electronic control unit 2 is furnished with the function of calculating an accumulated value of load exerted on the electric motor M, and storing the calculated accumulated value of load as a factor used for judging a deteriorated condition of the electric motor M. On the contrary, in this embodiment, the electronic control unit 2 (see FIG. 1) is furnished with a function of calculating a quantity of deterioration of the electric motor M based on a temperature of the electric motor M or an ambient temperature in the surroundings of the electric motor M, and storing an accumulated value of the calculated quantity of deterioration as a factor used for judging a deteriorated condition of the electric motor M.

To be more specific, in this embodiment, the electronic control unit 2 is provided with a deterioration speed calculation portion 201, a time integration portion 202, and an addition portion 203 that cooperatively calculate an accumulated value of the quantity of deterioration of the electric motor M, and an EEPROM 204 for storing the accumulated value of the quantity of deterioration. The deterioration speed calculation portion 201, the time integration portion 202, and the addition portion 203 are achieved through software by running a program on a CPU installed in the electronic control unit 2.

The deterioration speed calculation portion 201 calculates a deterioration speed V of the electric motor M using the Arrhenius equation that defines a relationship between the life of the electric motor M and the temperature T of the electric motor M or the ambient temperature T in the surroundings of the electric motor M.

The Arrhenius equation is expressed as:

$$L = A \cdot exp(B/T)$$

where L is the life of the electric motor M (A and B are constants determined for an individual electric motor M). Because the deterioration speed V of the electric motor M is an inverse number of the life L of the electric motor M, it can be expressed as:

$$V = 1/L = A^{-1} \cdot exp(-B/T) \qquad (1)$$

The deterioration speed calculation portion 201 thus calculates the deterioration speed V of the electric motor M according to Equation (1) above. The ambient temperature T may be detected by a temperature sensor provided in association with the electric motor M or calculated based on a detected value from a temperature sensor installed in the electronic control unit 2.

The deterioration speed V of the electric motor M calculated in the deterioration speed calculation portion 201 is inputted into the time integration portion 202. The time integration portion 202 integrates the deterioration speed V inputted from the deterioration speed calculation portion 201 with respect to time. The calculation in the deterioration speed calculation portion 201 is performed repetitively while the ignition key switch of the vehicle stays ON. The time integration portion 202 thus calculates a quantity of deterioration ∫Vdt of the electric motor M while the ignition key switch stays ON.

The quantity of deterioration ∫Vdt calculated in the time integration portion 202 while the ignition key switch stays ON is inputted into the addition portion 203 in response to turning-OFF of the ignition key switch. Upon input of the quantity of deterioration ∫Vdt from the time integration portion 202, the addition portion 203 reads out an accumulated value of the quantity of deterioration stored in the EEPROM 204. Then, it adds the quantity of deterioration ∫Vdt inputted from the time integration portion 202 to the read accumulated value of the quantity of deterioration, and writes the sum into the EEPROM 204 as a new accumulated value of the quantity of deterioration. An accumulated value of the quantity of deterioration ∫Vdt of the electric motor M since the electric power steering apparatus was mounted on the vehicle is thus stored into the EEPROM 204.

According to this arrangement, the same advantage as that in the first embodiment above can be attained. To be more specific, when a vehicle on which is mounted the electric power steering apparatus is scrapped, a deteriorated condition of the electric motor M can be judged based on an accumulated value of the quantity of deterioration of the electric motor M stored in the EEPROM 204 in the electronic control unit 2. It is thus possible to judge, for example, whether the electric motor M is reusable or not and therefore needs to be collected from the vehicle. Also, by taking the statistic of an accumulated value of the quantity of deterioration read out from the EEPROM 204 for each vehicle when it is scrapped, a relationship between the usage time and a quantity of deterioration of the electric motor M can be analyzed, which makes it easier to achieve the optimum life design of the electric motor M.

The above description has described two embodiments of the invention. It should be appreciated, however, that the invention can be implemented in still another embodiment. For example, in the first embodiment above, an accumulated value of load exerted on the electrical motor M is stored into the EEPROM 25. However, if a storage capacity of the EEPROM 25 is sufficiently large, as indicated by a broken line in FIG. 2, a history or log of work ∫Udt (load exerted on the electric motor M) having done by the electric motor M may be stored into the EEPROM 25 by additionally writing the work ∫Udt having done by the electric motor M calculated in the time integration portion 23 into the EEPROM 25, for example, each time the ignition key switch of the vehicle is turned OFF.

Also, in the second embodiment above, a quantity of deterioration ∫Vdt of the electric motor M is calculated based on the temperature of the electric motor M or the ambient temperature T in the surroundings of the electric motor M, and an accumulated value of the calculated quantity of deterioration ∫Vdt is stored into the EEPROM 204 as a factor used for judging a deteriorated condition of the electric motor M. However, if a storage capacity of the EEPROM 204 is sufficiently large, as indicated by a broken line in FIG. 3, a history or log of the quantity of deterioration ∫Vdt of the electric motor M may be stored into the EEPROM 204 by additionally writing the quantity of deterioration ∫Vdt of the electric motor M calculated in the time integration portion 202 into the EEPROM 204, for example, each time the ignition key switch of the vehicle is turned OFF.

Further, as indicated by a chain double-dashed line in FIG. 3, a history of the temperature T of the electric motor M or the ambient temperature T in the surroundings of the electric motor M may be stored into the EEPROM 204 by additionally writing the temperature T of the electric motor M or the ambient temperature T in the surroundings of the electric motor M into the EEPROM 204 in a certain period. In this case, when a vehicle on which is mounted the electric power steering apparatus is scrapped, the history of the ambient temperature T is read out from the EEPROM 204, and for example, a quantity of deterioration ∫Vdt of the electric motor M due to the respective ambient temperatures T is calculated, and a deteriorated condition of the electric motor M can be judged based on the calculated quantity of deterioration ∫Vdt or an accumulated value of the quantity of deterioration ∫Vdt.

Further, in the second embodiment above, it is arranged in such a manner that the deterioration speed calculation portion 201 calculates the deterioration speed V of the electric motor M due to the influence of the temperature T of the electric motor M or the ambient temperature T in the surroundings of the electric motor M according to Equation (1) based on the Arrhenius equation. However, it may be arranged in such a manner that the deterioration speed calculation portion 201 calculates the deterioration speed V of the electric motor M due to the influence of the temperature T of the electric motor M or the ambient temperature T in the surroundings of the electric motor M according to Equation (2) as follows based on the rule that the rate will double for a 10° C. rise in temperature:

$$V = V0 \cdot 2^{(T-T0)/10} \quad (2)$$

where V0 is an inverse number of the life of the electric motor M operating in atmosphere at the temperature T0.

Figure 4:
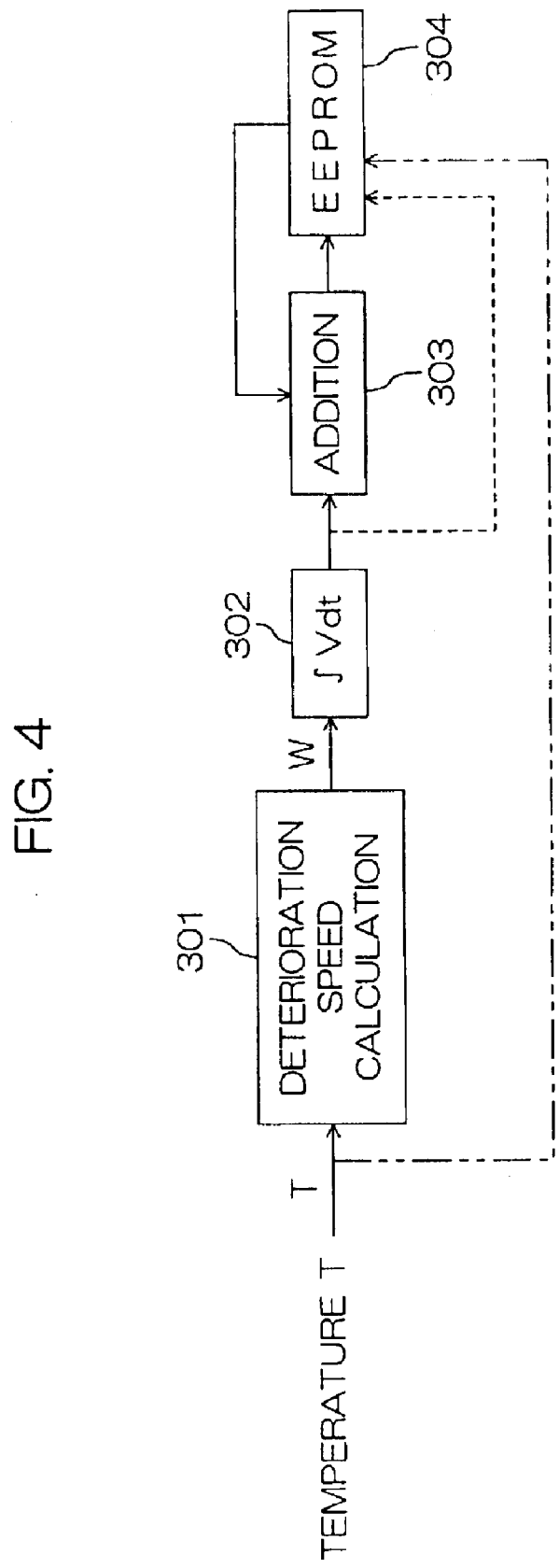
FIG. 4 is a block diagram explaining an arrangement according to still another embodiment of the invention.

Also, as shown in FIG. 4, besides the electric motor M, a history (chain double-dashed line) of the temperature T of the electronic control unit 2 or the ambient temperature T of the electronic control unit 2, a history (broken line) of a quantity of deterioration of the electronic control unit 2 calculated based on the temperature T of the electronic control unit 2 or the ambient temperature T of the electronic control unit 2, or an accumulated value of the quantity of deterioration of the electronic control unit 2 may be stored into an EEPROM 304 as a factor used for judging a deteriorated condition of the electronic control unit 2.

To be more specific, a deterioration speed calculation portion 301 calculates a deterioration speed W of the electronic control unit 2 based on the temperature T of the unit 2 or the ambient temperature T. Then, a time integration portion 302 integrates the deterioration speed W with respect to time, and thereby calculates a quantity of deterioration ∫Wdt. The preceding accumulated value of the quantity of deterioration stored in the EEPROM 304 is read out each time the ignition key switch is turned OFF. The addition portion 303 adds the quantity of deterioration ∫Wdt to the read accumulated value of the quantity of deterioration, and thereby calculates a new accumulated value of the quantity of deterioration. The new accumulated value of the quantity of deterioration is stored into the EEPROM 304.

As is indicated by a broken line, by writing a quantity of deterioration ∫Wdt into the EEPROM 304 each time the ignition key switch is turned OFF, a history or log of the quantity of deterioration ∫Wdt can be stored. Also, as is indicated by a chain double-dashed line, by additionally writing the ambient temperature T into the EEPROM 304 in a certain period, a history or log of the temperature T of the unit 2 or the ambient temperature T can be stored.

For example, in regard to an electrolytic capacitor in a circuit installed in the electronic control unit 2, a degree of reduction of capacity varies depending on the ambient temperature thereof. Hence, by storing a history of the ambient temperature T or the like of the electronic control unit 2 into the EEPROM 304, when a vehicle on which is mounted the electric power steering apparatus is scrapped, for example, it is possible to read out data stored in the EEPROM 304 and judge a deteriorated condition of the electronic control unit 2. Further, it is possible to judge whether the electronic control unit 2 is reusable or not and therefore needs to be collected from the vehicle. Moreover, by taking the statistic of the data readout from the EEPROM 304 for each vehicle when it is scrapped, a relationship between the usage time and a quantity of deterioration of the electronic control unit 2 can be analyzed, which makes it easier to achieve the optimum life design of the electronic control unit 2.

Further, applications of the invention are not limited to an electric power steering apparatus, and the invention can be applied to an electro-hydraulic pump type power steering apparatus in which an oil pump is driven by an electric motor to feed hydraulic fluid from the oil pump to a power cylinder coupled to the steering mechanism, and the power cylinder generates a steering assisting force.

The foregoing description described embodiments of the invention in detail. It should be appreciated, however, that these embodiments represent examples to provide clear understanding of the technical contents of the invention, and the invention is not limited to these examples. The sprit and the scope of the invention, therefore, are limited solely by the scope of the appended claims.

The present application corresponds to Japanese Patent Application No. 2001-331266 filed with the Japan Patent Office on Oct. 29, 2001, the contents of which are hereby incorporated by reference.

What is claimed is:

1. A power steering apparatus for assisting steering by conferring a steering assisting force according to a steering manipulation to a steering mechanism, the apparatus comprising:

an electric motor being driven under control according to the steering manipulation; and a deteriorated condition judging factor storage portion for storing a factor used for judging a deteriorated condition of the electric motor;

wherein the factor used for judging the deteriorated condition of the electric motor includes an accumulated value of work having been performed by the electric motor.

2. A power steering apparatus according to claim 1, further comprising:

a torque calculation portion for multiplying a motor current value by a predetermined torque constant to calculate torque generated by the electric motor;

a multiplication portion for multiplying the torque inputted from the torque calculation portion by a motor angular speed to calculate power of the electric motor; and a time integration portion for integrating the power inputted from the multiplication portion with respect to time to calculate the work having been performed by the electric motor.

3. A power steering apparatus for assisting steering by conferring a steering assisting force according to a steering manipulation to a steering mechanism, the apparatus comprising:

an electric motor being driven under control according to the steering manipulation; and a deteriorated condition judging factor storage portion for storing a factor used for judging a deteriorated condition of the electric motor;

wherein the factor used for judging the deteriorated condition of the electric motor includes a history of work having been performed by the electric motor.

4. A power steering apparatus according to claim 3, further comprising:

a torque calculation portion for multiplying a motor current value by a predetermined torque constant to calculate torque generated by the electric motor;

a multiplication portion for multiplying the torque inputted from the torque calculation portion by a motor angular speed to calculate power of the electric motor; and a time integration portion for integrating the power inputted from the multiplication portion with respect to time to calculate the work having been performed by the electric motor.

5. A power steering apparatus for assisting steering by conferring a steering assisting force according to a steering manipulation to a steering mechanism, the apparatus comprising:

an electric motor being driven under control according to the steering manipulation; and a deteriorated condition judging factor storage portion for storing a factor used for judging a deteriorated condition of the electric motor;

wherein the factor used for judging the deteriorated condition of the electric motor includes an accumulated value of a quantity of deterioration calculated based on a temperature of the electric motor or an ambient temperature in surroundings of the electric motor.

6. A power steering apparatus for assisting steering by conferring a steering assisting force according to a steering manipulation to a steering mechanism, the apparatus comprising:

an electric motor being driven under control according to the steering manipulation; and a deteriorated condition judging factor storage portion for storing a factor used for judging a deteriorated condition of the electric motor;

wherein the factor used for judging the deteriorated condition of the electric motor includes a history of a quantity of deterioration calculated based on a temperature of the electric motor or an ambient temperature in surroundings of the electric motor.

7. A power steering apparatus for assisting steering by conferring a steering assisting force according to a steering manipulation to a steering mechanism, the apparatus comprising:

an electric motor being driven under control according to the steering manipulation; and a deteriorated condition judging factor storage portion for storing a factor used for judging a deteriorated condition of the electric motor;

wherein the factor used for judging the deteriorated condition of the electric motor includes a history of a temperature of the electric motor or an ambient temperature in surroundings of the electric motor.

8. A power steering apparatus for assisting steering by conferring a steering assisting force according to a steering manipulation to a steering mechanism, the apparatus comprising:

an electronic control unit for controlling the steering assisting force to be conferred to the steering mechanism; and a deteriorated condition judging factor storage portion for storing a factor used for judging a deteriorated condition of the electronic control unit;

wherein the factor used for judging the deteriorated condition of the electronic control unit includes an accumulated value of a quantity of deterioration calculated based on a temperature of the electronic control unit or an ambient temperature in surroundings of the electronic control unit.

9. A power steering apparatus for assisting steering by conferring a steering assisting force according to a steering manipulation to a steering mechanism, the apparatus comprising:

an electronic control unit for controlling the steering assisting force to be conferred to the steering mechanism; and a deteriorated condition judging factor storage portion for storing a factor used for judging a deteriorated condition of the electronic control unit;

wherein the factor used for judging the deteriorated condition of the electronic control unit includes a history of a quantity of deterioration calculated based on a temperature of the electronic control unit or an ambient temperature in surroundings of the electronic control unit.

10. A power steering apparatus for assisting steering by conferring a steering assisting force according to a steering manipulation to a steering mechanism, the apparatus comprising:

an electronic control unit for controlling the steering assisting force to be conferred to the steering mechanism; and a deteriorated condition judging factor storage portion for storing a factor used for judging a deteriorated condition of the electronic control unit;

wherein the factor used for judging the deteriorated condition of the electronic control unit includes a history of a temperature of the electronic control unit or an ambient temperature in surroundings of the electronic control unit.

* * * * *